United States Patent Office
3,759,711
Patented Sept. 18, 1973

3,759,711

NITROGEN LINKED APPENDING QUINONE DIAZIDE LIGHT SENSITIVE VINYL POLYMER COMPOSITIONS AND ELEMENTS

Frederick J. Rauner and Ronald H. Engebrecht, Rochester, N.Y., assignors to Eastman Kodak Company, Rochester, N.Y.

No Drawing. Continuation-in-part of abandoned application Ser. No. 684,636, Nov. 21, 1967. This application Sept. 16, 1970, Ser. No. 72,896
Int. Cl. C07c *113/00;* G03c *1/54;* G03f *7/08*
U.S. Cl. 96—36 23 Claims

ABSTRACT OF THE DISCLOSURE

A light sensitive polymer having quinone diazide groups linked through nitrogen atoms to the polymer chain is particularly useful in photoresist compositions and for lithographic purposes.

This application is a continuation-in-part of our U.S. patent application Ser. No. 684,636, filed Nov. 21, 1967, now abandoned.

This invention relates to light sensitive polymeric quinone diazides suitable for use in the graphic arts. More particularly, it relates to light sensitive quinone diazide polymers and their use in photoresists and on lithographic plates.

The use of light sensitive quinone diazides for the manufacture of photocopies, for photoresists and on lithographic plates is well known. Exposure to light results in a solubility differential between the exposed and unexposed areas such that treatment with an appropriate solvent results in the desired images area being retained on a support. Certain quinone diazides such as the known naphthoquinone-1,2-diazide sulfonic acid esters have disadvantages in that they have a tendency to crystallize from the coated layer, thereby causing faults which will not stand up under some etching conditions.

Although some polymeric quinone diazides are known, the quinone diazide materials which are commonly used in the art are monomeric materials. These may be incorporated in an alkali soluble resinous binder or reacted with an alkali soluble resinous material so that they can be used satisfactorily either as a resist material or to withstand the wear on printing plates. However, the incorporation of binders with the light sensitive material may decrease the light sensitivity and also the usefulness of the solubility differential in obtaining development of the exposed material. Therefore, it has been desirable to obtain a polymeric material which would be light sensitive but which would not need a film forming polymer incorporated therein. It has also been desirable to find such a polymeric material which is a copolymer of light sensitive units with units which can be varied to modify the physical characteristics of the resultant polymer.

One object of this invention is to provide novel quinone diazide light sensitive polymers.

A further object is to provide novel film forming quinone diazide light sensitive polymers.

An additional object is to provide novel quinone diazide light sensitive polymers having a wide range of solubility characteristics.

Another object is to provide novel photosensitive compositions containing quinone diazide light sensitive polymers.

A further object is to provide novel photosensitive elements based on quinone diazide light sensitive polymers and processes of using these elements to prepare lithographic printing plates, photoresists and similar photomechanical images.

Additional objects will be apparent to those skilled in the art from the further description of the invention which follows.

We have now found light sensitive polymers which contain quinone diazide groups linked to the polymer backbone through nitrogen atoms. Suitably, the polymer backbone is derived from an addition polymer of a vinyl monomer containing reactive amino groups. The polymers can be used in the preparation of photomechanical images, such as photoresists or as the light sensitive material on lithographic plates.

Polymers of our invention can be prepared by the reaction of a polymer containing a free reactive nitrogen atom with a quinone diazide such as an acid ester of quinone diazide.

Such polymeric light sensitive materials, herein referred to as polymeric quinone diazides, can be dissolved in an organic solvent and applied as a solution to a support. The dried coating can be exposed imagewise to actinic radiation to alter the solubility of the exposed material. It is believed that such exposure decomposes the diazo structure in the light struck areas, as indicated by the following theoretical reaction sequence,

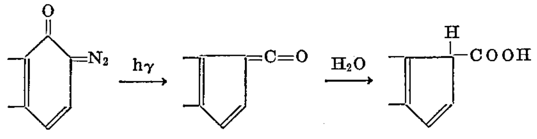

After exposure, the coating is developed to produce a useful image. When used in a positive working manner for the production of a positive copy of the original, the coating can be imbibed with a dilute alkali solution which dissolves the alkali soluble photodecomposition product. Thus, the exposed areas are washed away leaving a positive image of undecomposed light sensitive polymer.

When used in a negative working manner for the production of a negative copy of the original, the light sensitive polymer can be removed from the support material in the unexposed areas with developers containing organic solvents. The acid residues formed by decomposition during exposure adhere strongly to suitable support material and are not removed by the organic solvent treatment.

Film forming polymeric compounds having units of the following general structure are especially suitable for the preparation of the light sensitive layers of our invention:

$$-\overset{\displaystyle R}{\overset{|}{N}}-X-D$$

wherein R is a hydrogen atom or a lower alkyl group such as an alkyl group having 1–4 carbon atoms, X represents a sulfonyl group, $$-\overset{\displaystyle O}{\overset{\|}{\underset{\underset{\displaystyle O}{\|}}{S}}}-$$

or a carbonyl group, $$\left(-\overset{\displaystyle O}{\overset{\|}{C}}-\right)$$

and D represents a quinone diazide group.

The light sensitive quinone diazide groups can be chemically linked to the polymeric backbone by reaction with a reactive nitrogen atom appended to the polymer. In the case where the linkage is through a sulfonyl group it is a sulfonamide linkage, $$\left(-\overset{\displaystyle R}{\overset{|}{N}}-\overset{\displaystyle O}{\overset{\|}{\underset{\underset{\displaystyle O}{\|}}{S}}}-\right)$$

and where the linkage is through a carbonyl group it is a carbonamide linkage, $$\left(\begin{array}{c}\mathrm{R}\ \ \mathrm{O}\\ |\ \ \ \ \|\\ -\mathrm{N}-\mathrm{C}-\end{array}\right)$$

Polymers to which are attached the above $$\begin{array}{c}\mathrm{R}\\ |\\ -\mathrm{N}-\mathrm{X}-\mathrm{D}\end{array}$$

units include homo or copolymers which may be addition or condensation polymers, either natural or synthetic as well as mixtures of such polymers. The film forming polymers of this invention generally have a molecular weight in the range of about 2000 to 50,000, although they can have higher or lower molecular weights for particular applications.

The polymers of our invention are preferably prepared from addition type vinyl polymers and copolymers containing a reactive nitrogen group such as a reactive amino group or a reactive imino group and include aminostyrenes, polyvinyl amines, polyvinyl imines, polyaminoalkyl acrylamides, aniline substituted polyacrylic acid amides, polyvinyl anthranilates as well as amino containing heterocyclic nuclei polymers such as polymeric amino triazoles.

Condensation type polymers having free reactive nitrogen groups suitable for use in preparing the polymers of our invention include aniline formaldehyde type polymers wherein aniline and formaldehyde are condensed under strong acid conditions as described on page 280 of Golding, B., "Polymers and Resins," D. Van Nostrand, New York, 1959.

Gelatin represents one natural polymer having reactive nitrogen atoms suitable for preparing the polymers of our invention. Other proteins such as casein, zein, etc. can also be used.

The quinone diazides useful in the preparation of the polymers of our invention can differ in their constitution very widely, provided the compound contains at least one light sensitive quinone diazide moiety. Especially advantageous are the sulfonyl chlorides and carbonyl chlorides of compounds of the benzene, diphenyl, naphthalene or dinaphthyl series carrying one or more o-quinone diazide groupings, such as 1,2-benzoquinone-1-diazide,
1,2-naphthoquinone-1-diazide,
1,2-naphthoquinone-2-diazide,
1,2-(7-methoxy)naphthoquinone-2-diazide,
1,2-(6-chloro)naphthoquinone-2-diazide,
1,2-(7-chloro)naphthoquinone-2-diazide,
1,2-(6-nitro)naphthoquinone-2-diazide,
1,2-(5-carboxymethyl)naphthoquinone-1-diazide,
3,3',4,4'-diphenyl bis quinone-4,4'-diazide,
2,3-phenanthrenequinone-2-diazide,
2,3-phenanthrenequinone-10-diazide, and
3,4-chrysenequinone-3-diazide.

1,4-diazides may also be used.

One embodiment of our invention is a product formed by the reaction of a quinone diazide sulfonyl chloride with a polyaminostyrene. Another embodiment is a product formed by the reaction of a carbonyl chloride of a quinone diazide with polyaminostyrene. These products can be represented by the structural formula

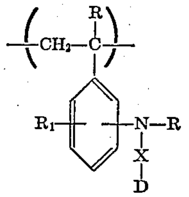

where $R_1$ is a hydrogen atom, a lower alkyl group, an aryl group or a halogen atom and R, X and D are as defined above.

In one particularly useful embodiment of our invention, an aminostyrene polymer is reacted with a 1,2-naphthoquinone-2-diazide sulfonylchloride to form a reaction product having the following structure:

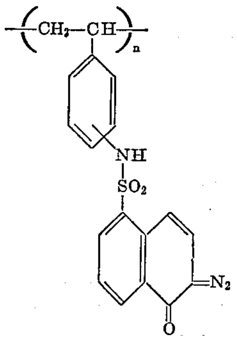

where $n$ is a whole integer of about 6 or greater. A particularly advantageous range of $n$ is from about 6 to 150.

In another embodiment, p-aminobenzaldehyde acetals of polyvinyl alcohol are reacted with the naphthoquinone diazide sulfonylchloride to yield polymers containing recurring units having the general structure:

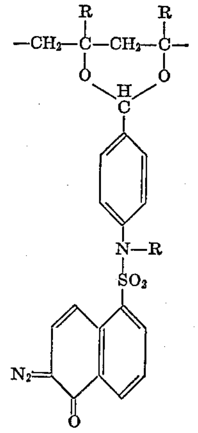

in which R is hydrogen or lower alkyl.

Similarly, light sensitive polymers containing quinone diazides can be prepared from polyvinyl anthranilates, polymeric aminotriazoles, polymeric aminoacrylates, etc. and similarly vinyl addition polymers.

As indicated above, a particularly useful embodiment of our invention includes those polymers formed with aminostyrene. The aminostyrene monomer may be the o, m or p variety or a mixture thereof. Various methods for their preparation are known, for example, "J. Amer. Chem. Soc.," 81, 2136 (1959) shows one method of preparation. p-Aminostyrene is especially useful. The preparation of this monomer has been described in "Dokl. Akad. Nauk." U.S.S.R., 164, 327 (1965). Copolymers of aminostyrene are well known in the art. Methods for their preparation have been described in "Plasticheskie Massy," 1963 (8) 63–65 ("Chem. Abstracts" 129 27F, 1963) and in U.S. Pat. 2,728,751. However, any suitable method can be used in the preparation of the aminostyrene polymers.

Light sensitive products of this invention can be prepared, as indicated above, from copolymers of an aminostyrene with other polymerizable unsaturated compounds containing the unit:

$$>C=C<$$

in an amount of 0–95% of the repeating units of the resultant polymer. Particularly suitable ethylenically unsaturated monomers contain fewer than 21 carbon atoms. Suitable ethylenically unsaturated polymerizable compounds which can be copolymerized with aminostyrene are, for example, styrene, acrylates, vinyl halides such as e.g. vinyl chloride, vinylidene chloride, vinyl esters such as e.g. vinyl acrylates, vinyl ketones, vinyl ethers, divinyl ethers, acrylonitrile, mixed esteramides and maleic anhydride, 1,3-butadiene, isoprene, chloroprene, divinylbenzene, acrylic and methacrylic acid derivatives such as nitriles, amides and esters, and the like.

Copolymers can be prepared by any suitable method including addition polymerization, for example, bulk, solution, bead and emulsion polymerization methods in the presence of a polymerization initiator. For example, polymerization of aminostyrene is conveniently carried out by contacting a mixture of aminostyrene and another polymerizable ethylenically unsaturated compound with from 0.1% to 10%, preferably 0.2 to 2%, of a free radical liberating polymerization initiator. The proportion of the monomers is selected so that the aminostyrene units amounts to at least 5% of the units in the finished copolymer.

Examples of suitable iintiators are peroxy compounds, for example, benzoyl peroxide or di(tertiary amyl)peroxide and azo initiators, for example, 1,1′-azodicyclohexanecarbonitrile or azodiisobutyronitrile. The polymerization can be carried out in the presence or absence of an inert solvent such as a hydrocarbon, for example, benzene, white mineral oil, or lubricating oil, acetic acid, dioxane, etc. and preferably in an inert atmosphere, for example, under a blanket of nitrogen. The mixture is maintained at a temperature at which the polymerization initiator generates free radicals rapidly. The exact temperature selected depends on the particular initiator being used. Temperatures ranging from room temperature or lower up to 150° C. or higher are suitable. It is usually desirable to carry the copolymerization substantially to completeness so that no unpolymerized monomer remains and the proportions of each component in the final product are essentially those of the original monomer mixture.

Photosensitive compositions can be prepared by forming a solution of the polymeric quinone diazide alone or mixed with a film forming material. These compositions can then be used to form resists or lithographic plates.

The solvents which can be employed as coating solvents in preparing coating compositions with the light sensitive materials of our invention are preferably organic solvents which may be selected from those which are capable of dissolving at least 0.2% by weight of the light sensitive materials employed but are unreactive toward the light sensitive materials and which are substantially incapable of attacking the substrates employed. Exemplary solvents include dimethylformamide, cyclohexane, cyclohexanone, acetonitrile, 2-ethoxyethanol, acetone, 4-butyrolactone, ethylene glycol monomethyl ether acetate (methyl Cellosolve acetate) and mixtures of these solvents with each other or with one or more of the lower alcohols and ketones.

The concentrations of light sensitive polymer in the coating solutions are dependent upon the nature of the light sensitive materials, the supports and the coating methods employed. Particularly useful coatings are obtained when the coating solutions contain 0.05 to 15 percent by weight, and preferably from 0.5 to 3 percent by weight, of light sensitive material.

It will be recognized that additional components can be incluedd in the coating compositions of our polymeric quinone diazide light sensitive resins. For example, dyes and/or pigments can be included to obtain colored images to aid in recognition. Alizarine dyes and azo dyes are particularly suited. Pigments such as Victoria Blue (Color Index Pigment Blue I) and Palomar Blue (Color Index Pigment Blue 15) can also be used. One method of providing particularly good recognition of image areas comprises the use of a print-out material with an inert dye.

For example, a green colored inert dye such as Alizarine Cyanine Green GHN Conc. (Color Index Acid Green 25) in combination with an azide print-out material such as diazido stilbene disulfonic acid disodium salt produces a yellow colored print-out on a green background.

It will be appreciated by those skilled in the art that it can be advantageous to include in the coating solutions materials which may serve to improve film formation, coating properties, adhesion of the coatings to the supports employed, mechanical strength, chemical resistance, etc. Exemplary materials include resins, stabilizers and surface active agents. When resins are employed, they are usually selected from those which are soluble in both the coating and developing solvents, although resins which are insoluble in the development solvents can also be included. The amounts of resins which are employed will vary with the particular combination of resin and light sensitive material employed. In general, useful results are obtained with coatings containing from 0.1 to 50 parts by weight of resin per part of light sensitive material.

In the preparation of light sensitive coating compositions for lithographic plates, it is advantageous to include small amounts of organic acids. The presence of such acids promotes clean development of the lithographic surface and helps to eliminate scum when the processed plate is run on a press. Suitable acids are oxalic malonic, sebacic, adipic, succinic, phthalic, isophthalic, citric, and butane tetracarboxylic acid.

Another group of materials which can be employed with the polymeric quinone diazide of this invention are the o-quinone diazide and end-capped polyalkylene glycols, as described in Rauner et al. U.S. application Ser. No. 857,587 filed Sept. 12, 1969 now Pat. 3,647,443, issued Mar. 7, 1972. The addition of such materials to coating compositions of this invention improves the physical and mechanical properties of the coatings without adversely affecting their light sensitivity.

Photosensitive elements are prepared by coating a solution containing at least one of the polymeric quinone diazides of our invention upon a suitable support material by one of the conventional techniques such as whirl coating, flow coating, dip coating, hopper coating, etc. and allowing to dry. The resulting photographic element can then be exposed to an imagewise pattern of actinic radiation, for example through a transparency, to a suitable radiation source such as an ultra violet light source or a carbon arc source and subsequently developed with a solvent for the exposed portions of the light sensitive coating such as an aqueous alkaline solution to obtain a photomechanical image suitable for use as a resist or in lithography. Since the image is oleophilic it can be used as is in lithographic printing or it can be heated to make it more receptive to greasy printing inks. The image can be lacquered to provide an image more resistant to wear on the press.

Typical lithographic support materials which are useful in our invention include supports such as zinc, anodized aluminum, grained aluminum, copper and specially prepared metal and paper supports; superficially hydrolyzed cellulose ester films; polymeric supports such as polyolefins, polyesters, polyamide, etc.

Preferably the photoresist compositions of our invention are prepared by combining at least one of the polymeric quinone diazides of this invention with a different film forming resin. For instance, the film forming resin can be a phenol formaldehyde resin such as those known as novolak or resole resins which are alkali soluble or alkali resistant. In a particularly useful embodiment, the weight ratio of diazide polymer to phenolic resin is in the range of about 1:1.5 to about 1:20 and results in especially good performance at a weight ratio of about 1:5 to about 1:10. The alkalinity of the developer solution needed to process the exposed resist depends upon the ratio of polymeric quinone diazide to phenolic resin. The alkali solution may range in strength up to that of 5% aqueous sodium hydroxide or higher.

It will be appreciated that the photoresist compositions can be provided in a dry form to be mixed with a suitable solvent. However, a particularly suitable way of providing the photoresist is in a solution using one or more volatile organic solvents which are solvents for both the phenolic resin and the diazide material. The solution can be used as provided or can be further diluted depending upon the purpose for which it is to be used.

The photoresist solution may be applied to a clean surface by spraying, dipping, whirling, etc., and air dried. If desired, a prebake of 10 to 15 minutes at 60° C. is given to remove residual solvent and the coating is exposed through a pattern to a light source such as a carbon arc. The resist coating, if positive acting, is then placed in a developer solvent such as an aqueous alkaline developer, to remove the exposed areas. The alkaline strength of the developer, as well as the presence of addenda such as solvents, is governed by the particular polymeric quinone diazide used, the resin employed and the ratio of diazide to resin. The developer can also contain dyes and/or pigments and hardening agents. The developed image is rinsed with distilled water, dried and optionally postbaked for 15 to 30 minutes at 60 to 80° C. The substrate can then be etched by acid etching solutions such as ferric chloride, or with alkaline etching solutions if alkaline resistant phenolic resins are employed in the composition.

Both thermosetting and thermoplastic phenolic resins are useful for incorporation in light sensitive coatings containing the quinone diazides of this invention, although for preparing resists the thermoplastic resins are preferred. Suitable resins are described in Chapter XV of "Synthetic Resins in Coatings," H. P. Preuss, Noyes Development Corporation, Pearl River, New York, U.S.A. If the thermosetting phenolic resins are used, care should be exercised to avoid heating the composition sufficiently to cause the resin to harden in a nonimagewise manner. The o-cresol-formaldehyde resins, such as produced in accordance with German Pat. 281,454 are particularly useful.

The most suitable phenolic resins are those which are insoluble in water and trichloroethylene but readily soluble in conventional organic solvents. For use with acid etchants the phenolic resin can be alkali soluble or not. For use with basic etchant, the phenolic resin is preferably alkali resistant, that is it is insoluble in strong alkali such as 20 percent sodium hydroxide and it is only slightly soluble or insoluble in alkanols such as isopropanol and ethanol. Novolak resins having a particularly desirable combination properties are those which have an average molecular weight in the range between about 350 and 40,000.

The photographic elements employed in our invention are exposed by conventional methods to a source of actinic radiation which is preferably an ultraviolet light source. The exposed elements are then developed by flushing, soaking, swabbing, or otherwise treating the light sensitive layers with a solvent or solvent system which exhibits a differential solvent action on the exposed and unexposed materials preferentially removing the materials which have not been modified by the action of actinic radiation. These developing solvents may be organic or aqueous in nature and will vary with the composition of the photographic layer to be developed. Exemplary solvents include water, aqueous acids and alkalis, the lower alcohols and ketones, and aqueous solutions of the lower alcohols, ether alcohols and ketones. The resulting images may then be treated in any known manner consistent with their intended use such as treatment with desensitizing etches, plate lacquers, etc.

The polymeric quinone diazides of our invention can be incorporated in other light sensitive resins. The amount of polymeric quinone diazides added to the light sensitive resin may be extremely small and depends upon the nature of the light sensitive resin as well as upon the particular quinone diazide employed. For instance, when the quinone diazide is used with a light sensitive polycarbonate, one part quinone diazide may be employed with four parts of the polycarbonate. It will be appreciated, however, that one part of the quinone diazide might be used with from 50 to 100 parts of a light sensitive resin.

The photoresist compositions of our invention can be employed as the resist component in photosensitive elements used to prepare metal mask images. Such elements comprise a durable transparent or translucent support having on one surface a metal layer (e.g., chromium, nickel) over which is coated a layer of a resist composition. Optionally, the resist composition can be protected from contamination during handling by overcoating it with a layer of a water soluble polymeric material which is removed prior to use. After exposure, development and etching of the element, there is obtained a durable metal image of superior resolution which can be used in the preparation of integrated circuits and for other uses where close tolerances are required. The preparation and use of this type of photosensitive element is described further in Lydick et al. U.S. Pat. 3,488,194, issued Jan. 6, 1970.

The photoresist compositions of our invention can also be employed to prepare phase holograms and in similar laser recording systems as described in British Pat. 1,139,-955.

The quinone diazide polymers can be used to form vesicular images, by heating the exposed polymeric quinone diazide. For instance, one or more quinone diazide polymers are either used alone or are incorporated in a polymeric material or mixture of polymeric materials such as a vinylidene chloride acrylonitrile copolymer and exposed imagewise to a carbon arc. The image is then developed by heating the exposed coating to a temperature of from 85 to about 120° C. for from 1 to 8 seconds. The time, of course, is inversely proportioned to the temperature at which the coating is heated. The heat treatment results in liberating nitrogen which forms bubbles imagewise in the polymeric vehicle. The resulting element can be viewed as a transparency, since the image areas scatter light.

Particularly advantageous plastic resins which may be used include those known in the art, such as, for example, polyvinyl chloride, copolymers of vinyl chloride and vinyl acetate, polyvinylidene chloride, vinyl chloride-vinylidene chloride copolymers, copolymers of vinylidene chloride and acrylonitrile, polymethyl methacrylate, copolymers of methyl methacrylate, polystyrene, polyvinyl alcohol, polyvinyl acetals, such as, polyvinyl formal, polyvinyl acetal, and polyvinyl butal and copolymers of polyvinyl alcohol with polyvinyl butal. The thermoplastic material of the opacifiable layer must have sufficiently low gas permeability so that the gas liberated by the decomposition of the quinone diazide will become entrapped in the thermoplastic matrix. Particularly useful amounts of polymeric quinone diazides vary from 1 to 50% by weight of the polymeric vehicles. In a preferred, embodiment, from 10 to about 30% by weight is used.

The following examples are intended to further illustrate our invention.

EXAMPLE 1

Preparation of homopolymer of p-aminostyrene p-Aminostyrene, 1 mole, is dissolved in 500 ml. of dioxane and 3.5 grams of 2,2′-azobis(2-methyl-propionitrile) are added. The solution is degassed by bubbling nitrogen through the reaction mixture for 30 minutes. The temperature is raised to 85° C. and the mixture is stirred for 16 hours. The polymer is precipitated in ether.

EXAMPLE 2

Preparation of the diazosulfonamide of the homopolymer of p-aminostyrene p-Aminostyrene homopolymer of Example 1 (4.4 grams, 37 millimoles) is dissolved in 50 ml. of dioxane and then added to 10.0 grams (37 millimoles) of 1,2-naphthoquinone-2-diazide-5-sulfonylchloride which has been dissolved in 75 ml. of dioxane. A saturated solution of sodium bicarbonate is added dropwise to the stirred reaction mixture. When the solution remains alkaline for 30 minutes, the reaction mixture is added to a 10-fold excess of dilute hydrochloride acid (0.1%) with rapid stirring. The yellow polymeric material is filtered and washed several times with water.

EXAMPLE 3

The preparation of copolymeric p-aminostyrene-styrene p-Aminostyrene (10.0 grams) is mixed with 30.0 grams of styrene and dissolved in 40 ml. of glacial acetic acid. The flask is swept with nitrogen for 30 minutes followed by the addition of 50 mg. of 2,2′-azobis(2-methyl-propionitrile) and immersion into a 50° C. bath. Two more 100 mg. samples of 2,2′-azobis(2-methyl-propionitrile) are added at two hour intervals and the reaction mixture left at 50° C. for 16 hours. The product is dripped into 2 liters of ether, the precipitate filtered and the copolymer washed 5 times with ether. The yield is 4.5 grams. The nitrogen content of the copolymer is found to be 10.5% which indicates a ratio of 1:7.5; styrene:p-aminostyrene units making up the copolymer chain. The infrared spectrum supports this conclusion.

EXAMPLE 4

Preparation of a light sensitive diazosulfonamide of copolymeric p-aminostyrene-styrene 2.1 grams of a styrene-p-aminostyrene copolymer of Example 3 is dissolved in 30 ml. of dioxane and added to 4.7 grams of 1,2-naphthoquinone-2-diazide-5-sulfonylchloride dissolved in 30 ml. of dioxane. Saturated sodium bicarbonate solution is added slowly until the solution remains basic to pH paper (pH 8). The reaction mixture is dripped into 1500 ml. of 0.1% hydrochloric acid and the yellow precipitate filtered and washed with water.

EXAMPLE 5

The in situ preparation of the 1,2-naphthoquinone-2-diazide-5-sulfonamide of copolymeric p-aminostyrene-styrene p-Aminostyrene (5.0 grams) in 10 ml. of dioxane is mixed with 25.0 grams of styrene in 55 ml. of dioxane. The flask is swept with nitrogen for 30 minutes followed by the addition of 0.9 gram of 2,2′-azobis(2-methyl-propionitrile) and immersion into an 80° C. bath for 16 hours. The product is stored at room temperature in the dioxane solution until used. The copolymer (15 ml.) is added to 2.7 grams of 1,2-naphthoquinone-2-diazide-5-sulfonylchloride dissolved in 50 ml. of dioxane. Saturated sodium bicarbonate solution is added slowly to the dioxane solution until the reaction mixture remains basic to pH paper (pH 8). The reaction mixture is dripped into 1500 ml. of water yielding a sticky, rubbery material. The product is redissolved in 100 ml. of acetone and reprecipitated into 2 liters of water. The product is air dried, yielding a solid, rubbery material.

EXAMPLE 6

Preparation of polymeric diazo amides by the reaction of aminostyrene-styrene copolymers with 1,2-naphthoquinone-2-diazide-3-carboxylic acid chloride.

A p-aminostyrene-styrene copolymer of Example 3 is dissolved in dioxane and then added to an equimolar quantity of 1,2-naphthoquinone-2-diazide - 3 - carboxylic acid chloride dissolved in dioxane. Pyridine is added dropwise to the stirred reaction mixture until the solution remains basic. The reaction mixture is added to a 20-fold excess of dilute hydrochloric acid (0.1%) with rapid stirring. The polymeric material is filtered and washed several times with water and air dried at room temperature.

EXAMPLE 7

The in situ preparation of the 1,2-naphthoquinone-2-diazide-5-sulfonamide of copolystyrene-o-aminostyrene o-Aminostyrene (12.0 grams, 0.1 mole) in 20 ml. of dioxane is mixed with 25.0 grams of styrene in 55 ml. of dioxane. After the addition of 0.9 gram of 2,2′-azobis-(2-methylpropionitrile), the flask is swept with nitrogen for one hour and immersed into an 80° C. bath for 16 hours. The copolymer is stored at 0° C. in the dioxane solution until used. The copolymer dope, as prepared above, is added to 27 grams (0.1 mole) of 1,2-naphthoquinone-2-diazide-5-sulfonylchloride dissolved in 150 ml. of dioxane. Saturated sodium bicarbonate solution is slowly added at 25° C. to the dioxane solution of polymer until the reaction mixture remains basic at pH 8. The reaction mixture is dripped into 1 liter of 0.1 percent hydrochloric acid and the yellow solid filtered and washed with water. The product is air dried at 40° C. for 16 hours. The light-sensitive polymer prepared from m-aminostyrene is synthesized in the same manner.

EXAMPLE 8

Copolymerization of methyl methacrylate and p-aminostyrene

Methyl methacrylate (1 mole), p-amino styrene (1 mole) and 3% by weight of monomers of 2,2′-azobis(2-methyl-propionitrile) are placed in a round bottom flask equipped with a stirrer and a nitrogen inlet and outlet tube. The reaction mixture is deaerated with nitrogen for 30 minutes. The reaction flask is immersed in an 85° C. constant temperature bath for 6 hours. The copolymers are stored in the freezer until reaction with the amino group.

Methyl methacrylate monomer for the above preparation is washed repeatedly with 5% sodium hydroxide, then it is washed twice with water, followed by two washings with a saturated solution of sodium bisulfite in water. It is finally washed twice more with water, dried over calcium chloride and then fractionally distilled at reduced pressure (B.P. 45° C., 90 mm.). The purified product is stored in the freezer until used.

EXAMPLE 9

Preparation of polymeric diazo sulfonamides of methyl methacrylate-p-aminostyrene copolymers A p-aminostyrene-methyl methacrylate copolymer of Example 8 is dissolved in dioxane and then added to an equimolar quantity of 1,2-naphthoquinone - 2 - diazide-5-sulfonylchloride dissolved in dioxane. A saturated sodium bicarbonate solution is added dropwise to the stirred reaction mixture until the solution remains basic. The reaction mxiture is poured into a 20-fold excess of dilute hydrochloride acid (0.1%) with rapid stirrings. The polymeric material is filtered and washed several times with water and air dried at room temperature.

EXAMPLE 10

Copolymerization of acrylonitrile and p-aminostyrene

Acrylonitrile (3 moles), p-aminostyrene (1 mole) and 3% by weight of the monomers of 2,2′-azobis(2-methyl-propionitrile) are placed in a round bottom flask equipped with a stirrer and an nitrogen inlet and outlet tube. The reaction mixture is deaerated with nitrogen for 30 minutes. The reaction flask is immersed in a 50° C. constant temperature bath for 15 minutes. The reaction becomes exothermic and the flask is removed from the bath. The polymer is dissolved in dimethyl formamide and precipitated into methanol, filtered and washed with methanol and then air dried at room temperature. An alternative method of preparation involves the same procedure except that the reaction is run in dioxane and heated at 60° C. for 16 hours. The copolymer (28 grams, 0.1 mole) in dioxane is reacted with 27 grams (0.1 mole) of 1,2-naphthoquinone-2-diazide-5-sulfonylchloride dissolved in 150 ml. of dioxane. Saturated sodium bicarbonate solution is added slowly to the dioxane solution until the reaction mixture remains basic. The product is dripped into 1 liter of 0.1 percent hydrochloride acid and the yellow solid filtered and washed with water. The product is air dried at 40° C. for 16 hours.

The products of Examples 2, 4, 5, 6, 7, 9 and 10 are dissolved, coated on supports, exposed and used to form photoresists with satisfactory results.

EXAMPLE 11

Positive working lithographic printing plate

A formulation is prepared as follows:

| | |
|---|---|
| Copolymeric p-aminostyrene-styrene sulfonamide of 1,2-naphthoquinone-2-diazide-5-sulfonyl chloride (as prepared in Example 5) ----------g-- | 1.25 |
| Cyclohexanone ----------cc-- | 50.0 |
| Acetone ----------cc-- | 50.0 |

The formulation is whirl coated on carboxymethyl cellulose treated anodized aluminum substrate at 78 r.p.m. for 15 minutes plus an additional 2 minutes with forced warm air followed to an additional 10 minutes at 40° C. The coated plate is exposed imagewise to a 95 amp carbon arc at a distance of 5 feet for 2–3 minutes. Following the exposure, the plate is swab developed using an aqueous alkaline developer. The plate is given a water rinse and wiped dry. The light struck areas are readily removed. A dilute acid solution is applied to neutralize the alkaline developer and the plate is wiped dry. A gum solution is applied and the image areas are hand inked using a rub-up ink. Ten thousand impressions are made on a duplicator press with little or no image loss during the length of the run.

EXAMPLE 12

Additional inert resin

The addition of inert alkali soluble resins to the light sensitive condensation product of our invention is used advantageously for the preparation of a particularly useful acid resist. Glossy coatings of high solid content having the good acid resistance required of etch resists are obtained in the following manner. A solution is prepared by adding 40 grams of cresol-formaldehyde resin to 100 ml. of ethylene glycol monomethyl ether acetate. A second solution containing 20 grams of polymer of Example 5 is prepared in 100 ml. of ethylene glycol monomethyl ether acetate. A mixture of the two solutions is prepared for coating on a copper plate from 2 parts of the cresol-formaldehyde resin solution and 1 part of the light sensitive polymer solution. A coating is prepared by which the surface of a support is covered by a continuous layer of desired thickness. Drying at room temperature is followed by drying and heating the plate to 75° C. for 30 minutes. The dried coating is exposed in contact through a stencil image for 2–5 minutes to a carbon arc at an intensity of 200 foot-candles. The image is developed in a caustic solution of 1.3% sodium hydroxide for 2–3 minutes to remove the exposed areas. The processed plate may be etched directly in ferric chloride, 42° Bé. without further baking. Even after 1–2 hours in the etch solution, there is no image breakdown of the resist. Etching at room temperature at 50° C. may be carried out without adversely affecting the resist image. Other inert resins, for example, chlorinated rubber polymers, phenoxy resins, chlorinated biphenyls, modified rosin, copolymers of maleic anhydride with styrene or vinyl methyl ether, vinylidene chloride-acrylontrile copolymers, terpolymers of vinylidene chloride and acrylonitrile with acrylic acid or itaconic acid, polyacrylic acids, methyl-methacrylate-methacrylic acid copolymers cellulose esters such as cellulose acetate stearate and the like, are similarly used to advantage mixed with the light sensitive polymers of our invention.

EXAMPLE 13

Resist

A positive working resist for an acid etch solution is prepared from the light sensitive polymer prepared in Example 5 according to the following composition:

| | |
|---|---|
| Polymer of Example 5 ----------grams-- | 10.0 |
| Cyclohexanone ----------ml-- | 80.0 |
| Acetone ----------ml-- | 20.0 |

The formulation is whirl coated for 10 minutes at 78 r.p.m. on gravure copper sheet 4 inches by 5 inches which has been previously cleaned in acetone solvent. The coating is dried for 5 minutes at 75° C. This results in a striation-free coating of high gloss. The coating is exposed to a carbon arc at 2000 foot-candles for 5 minutes. It is developed in a tray of a 2% caustic solution with swabbing to remove the exposed areas. After rinsing in water and drying, the image has good gloss and adhesion. The resist coated plate is successfully etched for 45 minutes in ferric chloride to a depth of 1.5 mils without image breakdown.

EXAMPLE 14

Added non-light sensitive chlorinated biphenyl resin

The addition of a chlorinated biphenyl resin to the light sensitive polymeric quinone diazides of Example 5 increases the development latitude with regards to alkali concentration of the developer. To illustrate, a coating formulation for an acid resist is prepared to contain:

A

| | |
|---|---|
| Polymer (Example 5) ----------grams-- | 4.0 |
| o-Cresol-formaldehyde resin ----------do---- | 23.0 |
| 100% phenolic resin non-heat hardenable --do---- | 11.0 |
| Methyl Cellosolve acetate ----------ml-- | 93.0 |
| 4-butyrolactone ----------ml-- | 7.0 |

B

A second formulation is made to contain in addition to the above

| | Grams |
|---|---|
| A chlorinated biphenyl ---------- | 0.4 |
| Malonic acid ---------- | 0.2 |

Coatings are prepared on copper plates from the above two solutions by whirl coating. Drying takes place at 75° C. for 30 minutes. Additional plates are prepared and dried at 75° C. and 90° C. for 30 minutes. All of the plates are then exposed to a carbon arc at 2000 foot-candles for 4 minutes. Results of development in various concentrations of aqueous sodium hydroxide for 2 minutes are shown below.

| | Drying temperature, ° C. | Concentration of alkali developer (percent) .9 | 1.0 | 1.2 | 1.4 |
|---|---|---|---|---|---|
| Coating A---------- | 75 | None--- | Good--- | Poor---- | Poor.[1] |
| | 90 | ---do------- | do------- | do---- | Do. |
| Coating B---------- | 75 | ---do------- | do---- | Good--- | Good. |
| | 90 | ---do---- | None------ | do---- | Do. |

[1] Poor—resist areas are attacked by the developer as indicated by a matte surface, striations, etc.

Related results for a 3-minute development time similarly indicate the greater latitude in developer concentration with the presence of the chlorinated biphenyls. Similar increase of development latitude results with the addition of a phenoxy resin, such as the copolymer of epichlorohydrin and Bisphenol A.

EXAMPLE 15

Lithographic plate

A negative working lithographic plate having high photographic speed and a visible image on development can be produced by coating the light sensitive quinone diazide polymer of our invention onto an anodized aluminum support. The coating solution is prepared from:

| | | |
|---|---|---|
| Light sensitive polymer (Example 5) | grams | 1.5 |
| Ethylene glycol monomethyl ether acetate | ml | 95.0 |
| 4-butyrolactone | ml | 5.0 |

The above solution is poured onto a 10- by 15-inch anodized aluminum sheet and whirl coated. Additional drying took plate at 35° C. to 2 hours. The dried plate is exposed for 3 minutes to a carbon arc at 2000 foot-candles through a negative transparency. At the end of the exposure time, the image could be easily recognized since the light sensitive areas are bleached to form a very light yellow image on a darker yellow background. The plate is swab developed using 4-butyrolactone on a cotton swab to remove the non-exposed areas. The adhesion of the light sensitive polymer to the aluminum surface is very good. The plate is further treated with a dilute (2%) alkaline solution followed by an acid desensitizing etch. The image is hand inked with a lithographic developing ink and run on a lithographic press. Five hundred press impressions are made with little or no image loss. The plate has good ink receptivity.

EXAMPLE 16

Positive images

A positive working image forming system is made using the light sensitive polymeric quinone diazides of our invention by the incorporation of a coupler component. In one embodiment, a clean polyester support is flow coated with a solution containing:

| | | |
|---|---|---|
| 2% polymer of Example 5 in ethylene glycol monomethyl ether acetate | ml | 5.00 |
| Resorcinol | gram | .07 |

The coated support is hung to dry for 5 minutes at 75° C. A clear light yellow transparent coating is formed. The element is exposed to a line image employing a carbon arc at 2000 foot-candles for 4 minutes. The exposed areas are bleached out to become essentially colorless. Development with ammonia fumes causes a dark mustard colored image to be formed in the unexposed areas while the background remains clear.

EXAMPLE 17

Formation of a vesicular image in vinylidenechloride acrylonitrile copolymer

A light sensitive coating suitable for the preparation of a vesicular image is made on a clear polyester support in the following way:

A coating formulation is made to contain:

| | | |
|---|---|---|
| Vinylidinechloride-acrylonitrile copolymer | grams | 10 |
| Reaction product of o-quinone diazide sulfonylchloride with p-aminostyrene-styrene copolymer of Example 4 | grams | 2.1 |
| Dioxane | cc | 20 |
| Acetone | cc | 20 |
| Methoxyethanol | cc | 10 |

This solution is coated at a wet thickness of .008 inch and dried at room temperature. The dried coatings are imagewise exposed for 3 minutes to a carbon arc at 2000 foot-candles. Images are developed by heating the exposed coatings to 105° C. for 4 seconds. When the images are viewed from the direction of the incidence of the light, the image appears white; when used as a transparency for projection, the image areas scatter light and may be used as standard black and white slides. Similar results are obtained when light sensitive polymeric quinone diazides of our invention are used in other thermoplastic vehicles including poly(vinyl chloride), copolymers of vinyl chloride and vinyl acetate, poly(vinylidene chloride), vinyl chloride-vinylidene chloride copolymers, copolymers of vinylidene chloride and acrylonitrile, poly(methyl methacrylate), copolymers of methyl methacrylate, polystyrene, poly(vinyl alcohol), poly(vinyl acetals), such as poly(vinylformal), poly(vinylacetal), and poly(vinyl butyral), and copolymers of poly(vinyl alcohol) with poly(vinyl butyral). The thermoplastic material of the opacifiable layer has sufficiently low gas permeability so that the gas liberated by the decomposition of the decomposable compound becomes entrapped in the thermoplastic matrix.

EXAMPLE 18

Positive working lithographic printing plate including inert resin in light sensitive coating A formulation is prepared as follows:

| | | |
|---|---|---|
| Copolymeric p-aminostyrene - styrene sulfonamide of 1,2-naphthoquinone - 2 - diazide - 5 - sulfonyl chloride (as prepared in Example 4) | grams | 3.5 |
| Phenol-formaldehyde resin | do | 1.75 |
| Malonic acid | do | .008 |
| Methoxyethanol | cc | 47.0 |
| Methyl Cellosolve acetate | cc | 47.0 |
| Butyrolactone | cc | 6.0 |

The solution is whirl coated at 80 r.p.m. onto a sheet of anodized aluminum. It is dried for about 20 minutes at room temperature, followed by heating at 80° C. for 15 minutes. The plate is exposed to a positive transparency having halftones and line subject matter using an ultraviolet light source. The exposed plate is swab processed with a solution containing:

| | Cc. |
|---|---|
| Isopropanol | 38.0 |
| Triethanolamine | 10.0 |
| Glycerol | 15.0 |
| Water | 37.0 |

The plate is run on a lithographic press to produce more than 40,000 copies without signs of appreciable wear.

EXAMPLE 19

Preparation of positive resist layer which is resistant to alkaline etch

A positive resist formulation is prepared based on the polymer of Example 5 and a high alkaline resistant thermoplastic phenolic resin. An alkyl phenol novolak is incorporated to further improved chemical resistance and to reduce any tendency toward pinholing.

The positive resist formulation is prepared as follows:

| | | |
|---|---|---|
| Polymer of Example 5 | g | 7.0 |
| Alkaline resistant thermoplastic phenolic resin (Varcum Resin 4327X sold by Reichhold Chemicals, Inc.) | g | 14.0 |
| Alkyl phenol novolak (Catalin CR8318 sold by Ashland Chemical Co.) | g | 2.0 |
| Methyl Cellosolve acetate | cc | 80.0 |
| 4-butyrolactone | cc | 20.0 |

The formulation is filtered through a 0.01 micron filter, and is whirl coated at 1000 r.p.m. on 2-inch by 2-inch squares of chrome plate glass at room temperature until dry to obtain a dry coating thickness of 0.94 micron. The coatings are pre-baked for 10 minutes at 80° C. The coated plates are exposed imagewise through a microimage for 1½ minutes to a 95 amp carbon arc at a distance of 4 feet. All of the plates are developed in the following developer for 60 seconds to produce images of high quality.

| | Cc. |
|---|---|
| Isopropanol | 400 |
| Diethanolamine | 100 |
| Nonionic surfactant (Triton X–100 sold by Rohm and Haas Co.) | 26 |
| Water | 500 |

Individual coatings are then treated as follows: no post bake, 10 minutes postbake at 120° C., 140° C., 160° C. or 250° C. The coatings are then etched in the following alkaline solution

| | G. |
|---|---|
| Solution A: | |
| Potassium ferricyanide | 10.0 |
| Distilled water | 50.0 |
| Solution B: | |
| Sodium hydroxide | 25.0 |
| Distilled water | 50.0 |

Three parts of Solution A mixed with one part of Solution B.

The chrome is removed in approximately 45 seconds from the areas unprotected by the resist. Good images are obtained for all conditions of postbake treatment.

EXAMPLE 20

Circuit board

The improved resist composition of Example 19 containing the highly alkaline insoluble phenolic resin is also useful in applications requiring acid resistance. A particularly useful application is in the preparation of printed circuit boards. The formulation described in Example 19 is whirl coated at 80 r.p.m. for 10 minutes on a copper laminated circuit board to yield a coating having a thickness of 0.0001 inch. The coating is prebaked for 20 minutes at 80° C. and imagewise exposed to a 95 amp carbon arc for 4 minutes at a distance of 4 feet. The board is developed for 2 minutes in the developer shown in Example 19 and rinsed with water and dried. It is then etched in a 42° Bé. ferric chloride solution at 140° F. for 3 minutes. The resist shows excellent protective properties with no pinholes or failure at the edges of the image areas.

EXAMPLE 21

Holographic recording

This example illustrates the preparation of a hologram using a composition containing the quinone diazide polymers of this invention and a second quinone diazide. A coating composition is prepared having the following composition:

| | | |
|---|---|---|
| Polymer of Example 5 | grams | 8.6 |
| Cresol formaldehyde resin | do | 30.0 |
| Polyethylene glycol end capped with 5-sulfonyl-1,2-naphthoquinone - 2 - diazide (Example 1, U.S. Ser. No. 857,587 filed Sept. 12, 1969) | grams | 0.4 |
| 2-methoxy ethyl acetate | cc | 261.0 |

This formulation is coated at .070 g./ft.$^2$ dry coverage on subbed poly(ethylene terephthalate) support to yield a coating 1.0 micron thick. A Cd-He laser beam (441.6 nm.) is passed through a beam splitter and the two resulting beams superimposed at the film plane of a sample holder containing the element described above. The resulting 800 cycle/ millimeter interference pattern is used as a test of the holographic capability of this composition. After exposure the sample is developed in a dilute alkaline solution and returned to the sample holder where it is interrogated with a single laser beam, yielding 0, 1, 2 . . . $n$ order images of the original beam. The first order image produces a high resolution pure phase hologram of excellent quality.

The invention has been described in detail with particular reference to preferred embodiments thereof, but it will be understood that variations and modifications can be effected within the spirit and scope of the invention.

What is claimed is:

1. A photosensitive composition comprising a light sensitive polymeric amido compound formed by reacting a polymer formed by the addition polymerization of one or more compounds having $$>C=C<$$

repeating units and containing at least 5% aminostyrene repeating units based on the total number of said $$>C=C<$$

repeating units of said addition polymer, with a quinone diazide having reactive sulfonyl or carbonyl ring substituent moieties which react with the amino groups of said aminostyrene repeating units to form amido moieties.

2. A photosensitive composition of claim 1 further comprising a non-light-sensitive film forming phenol-formaldehyde resin wherein the ratio of light sensitive polymer to non-light-sensitive resin is in the range of 1:1.5 to 1:20.

3. A photosensitive composition of claim 2 wherein the non-light sensitive resin is a thermoplastic phenolic resin.

4. A photosensitive composition of claim 1 further comprising a non-light-sensitive film forming alkali soluble phenolic resin wherein the ratio of light sensitive polymer to non-light-sensitive resin is in the range of 1:1.5 to 1:20.

5. A photosensitive composition of claim 1 further comprising a non-light-sensitive film forming alkali resistant phenolic resin wherein the ratio of light sensitive polymer to non-light-sensitive resin is in the range of 1:1.5 to 1:20.

6. A photosensitive composition comprising a solution of a light sensitive polymeric amido compound formed by reacting a polymer formed by the addition polymerization of one or more compounds having $$>C=C<$$

repeating units and containing at least 5% aminostyrene repeating units based on the total number of said $$>C=C<$$

repeating units of said addition polymer, with a quinone diazide having reactive sulfonyl or carbonyl ring substituent moieties which react with the amino groups of said aminostyrene repeating units to form amido moieties, a major proportion of said solution being an organic solvent for said polymer wherein, said solvent is employed as a coating aid.

7. A photosensitive composition comprising a solution of a light sensitive polymeric 1,2-naphthoquinone-2-diazide-5-sulfonamide of styrene and a thermoplastic phenolic resin, the ratio of light sensitive polymer to phenolic resin being in the range 1:5 to 1:10 in an organic solvent.

8. A photosensitive element comprising a support bearing a layer of a photosensitive composition comprising a light sensitive polymeric amido compound formed by reacting a polymer formed by the addition polymerization of one or more compounds having $$>C=C<$$

repeating units and containing at least 5% aminostyrene repeating units based on the total number of said $$>C=C<$$

repeating units of said addition polymer, with a quinone diazide having reactive sulfonyl or carbonyl ring substituent moieties which react with the amino groups of said aminostyrene repeating units to form amido moieties.

9. An element of claim 8 wherein the support is a metallic support.

10. An element of claim 9 wherein the metallic support is an anodized aluminum support.

11. An element of claim 9 wherein the support is a copper support.

12. An element of claim 9 wherein the support is a chromium coated glass support.

13. A process for preparing a photomechanical image which comprises exposing to an imagewise pattern of actinic radiation an element of claim 8 to effect a differential in solubility between exposed and unexposed areas of the element and developing an image by removing one of said areas with a solvent therefore which is a non-solvent for the other of said areas.

14. A process as defined in claim 13 wherein the developing solvent is an aqueous alkaline solution and the areas which are removed are the exposed areas.

15. A process as defined in claim 13 wherein the developing solvent is an organic solvent and the areas which are removed are the unexposed areas.

16. A photosensitive element comprising
a support and
a photosensitive composition in a coating therein, said composition comprising a light sensitive polymeric amido compound formed by reacting a polymer formed by the addition polymerization of one or more compounds having

repeating units and containing at least 5% aminostyrene repeating units based on the total number of said

repeating units of said addition polymer, with a quinone diazide having reactive sulfonyl or carbonyl ring substituent moieties which react with the amino groups of said aminostyrene repeating units to form amido moieties, and a non-light-sensitive film forming phenol-formaldehyde resin wherein the light sensitive polymer to non-light-sensitive resin is in the range of 1:1.5 to 1:20.

17. A photosensitive element comprising
a support having
a coating thereon capable of producing a positive printing image upon contact with an aqueous alkaline developing solvent and a negative printing image upon contact with an organic developing solvent comprising a light sensitive polymeric amido compound formed by the addition polymerization of one or more compounds having

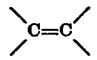

repeating units and containing at least 5% aminostyrene repeating units based on the total number of said

repeating units of said addition polymer, with a quinone diazide having reactive sulfonyl or carbonyl ring substituent moieties which react with the amino groups of said aminostyrene repeating units to form amido moieties.

18. A photosensitive element according to claim 17 in which said support is an anodized aluminum support, at least 5% of said repeating units have the following structure:

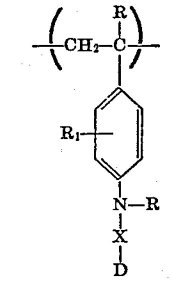

wherein R is a hydrogen atom or a lower alkyl group, $R_1$ is a hydrogen atom, a lower alkyl group, an aryll group or a halogen atom, X represents a sulfonyl or carbonyl group and D represents a quinone diazide group and, said coating additionally including a thermoplastic phenolic resin, the ratio of light sensitive polymer to phenolic resin being in the range of 1:1.5 to 1:20.

19. A photosensitive element according to claim 17 in which said light sensitive polymeric amido compound is a light sensitive quinone diazide polymer having repeating units of the following structure:

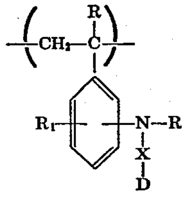

wherein R is a hydrogen atom or a lower alkyl group, $R_1$ is a hydrogen atom, a lower alkyl group, an aryl group or a halogen atom, X represents a sulfonyl or carbonyl group and D represents a quinone diazide group.

20. A photosensitive element according to claim 19 in which X represents a sulfonyl group and D represents a 1,2-naphthoquinone-2-diazide group.

21. A photosensitive element according to claim 19 in which X represents a carbonyl group and D represents a 1,2-naphthoquinone-2-diazide group.

22. A photosensitive element comprising
a support having
a coating thereon capable of producing a positive image upon contact with an aqueous alkaline developing solvent, said coating comprising
a light sensitive polymeric amido compound formed by reacting a polymer formed by the addition polymerization of one or more compounds having

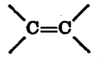

repeating units and containing at least 5% aminostyrene repeating units based on the total number of said

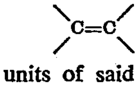

repeating units of said addition polymer, with a quinone diazide having reactive sulfonyl or carbonyl ring substituent moieties which react with the amino groups of said aminostyrene repeating units to form amido moieties and
a non-light-sensitive film forming phenolic resin wherein the ratio of light sensitive polymer to non-light-sensitive resin is in the range of 1:1.5 to 1:20.

23. A photosensitive element comprising a metallic support bearing a layer of a photosensitive composition comprising a light sensitive polymeric 1,2-naphthoquinone-2-diazide-5-sulfonamide of styrene and a thermoplastic phenolic resin, the ratio of light sensitive polymer to phenolic resin being in the range of 1:5 to 1:10.

(References on following page)

References Cited

UNITED STATES PATENTS

| | | | |
|---|---|---|---|
| 3,502,470 | 3/1970 | Delzenne et al. | 96—91 D X |
| 3,526,503 | 9/1970 | Dunham et al. | 96—91 D X |
| 3,126,281 | 3/1964 | Sus et al. | 96—91 D X |
| 3,269,837 | 9/1966 | Sus | 96—91 D X |
| 3,230,087 | 1/1966 | Sus et al. | 96—91 R X |
| 3,231,377 | 1/1966 | Dickinson et al. | 96—91 R X |
| 3,050,387 | 8/1962 | Neugebuer et al. | 96—91 D X |
| 3,494,767 | 2/1970 | Lavidon et al. | 96—91 D X |
| 3,046,120 | 7/1962 | Schmidt et al. | 96—91 D X |
| 3,288,608 | 11/1966 | Coutaud et al. | 96—91 D |
| 3,533,796 | 10/1970 | Lassig et al. | 96—91 D |

FOREIGN PATENTS

| | | | |
|---|---|---|---|
| 1,026,144 | 4/1966 | Great Britain | 96—91 D |
| 1,073,098 | 6/1967 | Great Britain | 96—91 D |
| 865,860 | 2/1953 | Germany | 96—91 D |
| 113,289 | 1/1965 | Czechoslovakia | 260—241 |

OTHER REFERENCES

Dinaburg, M. S., "Photosensitive Diazo Compounds" The Focal Press, 1964, pp. 181–200 relied on.

CHARLES L. BOWERS, Jr., Primary Examiner

U.S. Cl. X.R.

96—33, 27 H, 36.3, 49, 75, 91 N, 35.1, 115 R, 86; 260—141

PO-1050
(5/69)

UNITED STATES PATENT OFFICE
CERTIFICATE OF CORRECTION

Patent No. 3,759,711 Dated September 19, 1973

Inventor(s) Frederick J. Rauner and Ronald H. Engebrecht

It is certified that error appears in the above-identified patent and that said Letters Patent are hereby corrected as shown below:

Column 10, line 71, change "an" to read ---a---.

Column 11, line 31, change "to" to read ---by---.

Column 14, line 52, "high" should read ---highly---.

Column 14, line 68, "plate" should read ---plated---.

Column 17, Claim 13, line 17, "therefore" should read ---therefor---.

Column 17, Claim 16, line 27, "therein" should read ---thereon---.

Column 18, Claim 18, line 14, "aryll" should read ---aryl---.

Signed and sealed this 10th day of September 1974.

(SEAL)
Attest:

McCOY M. GIBSON, JR.
Attesting Officer

C. MARSHALL DANN
Commissioner of Patents